United States Patent
Inoue et al.

(10) Patent No.: US 12,320,706 B2
(45) Date of Patent: Jun. 3, 2025

(54) TEMPERATURE MEASUREMENT METHOD, OPTICAL HEATING METHOD, AND OPTICAL HEATING DEVICE

(71) Applicant: Ushio Denki Kabushiki Kaisha, Tokyo (JP)

(72) Inventors: Takahiro Inoue, Tokyo (JP); Shinji Taniguchi, Tokyo (JP); Takafumi Mizojiri, Tokyo (JP)

(73) Assignee: Ushio Denki Kabushiki Kaisha, Tokyo (JP)

( * ) Notice: Subject to any disclaimer, the term of this patent is extended or adjusted under 35 U.S.C. 154(b) by 650 days.

(21) Appl. No.: 17/665,167

(22) Filed: Feb. 4, 2022

(65) Prior Publication Data

US 2022/0260421 A1 Aug. 18, 2022

(30) Foreign Application Priority Data

Feb. 12, 2021 (JP) .................. 2021-021084

(51) Int. Cl.
*G01J 5/00* (2022.01)
*H01L 21/67* (2006.01)

(52) U.S. Cl.
CPC ....... *G01J 5/0007* (2013.01); *H01L 21/67115* (2013.01)

(58) Field of Classification Search
CPC . G01J 5/0003; G01J 5/0007; H01L 21/67115; H01L 21/67248; H01L 22/00
See application file for complete search history.

(56) References Cited

U.S. PATENT DOCUMENTS

2006/0051077 A1 3/2006 Kubo
2006/0057826 A1 3/2006 De Boer
(Continued)

FOREIGN PATENT DOCUMENTS

JP S61-176131 A 8/1986
JP H07-134069 A 5/1995
(Continued)

OTHER PUBLICATIONS

An Office Action; "Decision of Refusal," mailed by the Japanese Patent Office on Mar. 11, 2022, which corresponds to Japanese Patent Application No. 2021-021084 and is related to U.S. Appl. No. 17/665,167; with English language translation.
(Continued)

*Primary Examiner* — Randy W Gibson
(74) *Attorney, Agent, or Firm* — Studebaker Brackett PLLC

(57) ABSTRACT

A temperature measurement method comprises a step (A) of lighting a light source part to irradiate a substrate to be treated that is an object to be heated with light for heating, the light source part including a plurality of semiconductor light-emitting elements that emits light having a main emission wavelength range of 0.3 μm or more and less than 0.5 μm; a step (B) of turning off the light source part after the step (A); a step (C) of maintaining an unlit state of the light source part after the step (B); and a step (D) of measuring, during the step (C), a temperature of the substrate to be treated through observation of light emitted from the substrate to be treated using a thermometer having a sensitivity wavelength range different from the main emission wavelength range of light emitted from the light source part.

6 Claims, 4 Drawing Sheets

(56) References Cited

U.S. PATENT DOCUMENTS

| | | |
|---|---|---|
| 2008/0226272 A1 | 9/2008 | Kasai et al. |
| 2016/0064242 A1 | 3/2016 | Obweger et al. |
| 2022/0238394 A1* | 7/2022 | Taniguchi ............ H01L 21/324 |

FOREIGN PATENT DOCUMENTS

| | | |
|---|---|---|
| JP | 2003-077857 A | 3/2003 |
| JP | 2006-066452 A | 3/2006 |
| JP | 2006-509367 A | 3/2006 |
| JP | 2007-141896 A | 6/2007 |
| JP | 2016-046531 A | 4/2016 |

OTHER PUBLICATIONS

An Office Action; "Notice of Reasons for Refusal," mailed by the Japanese Patent Office on Dec. 22, 2022, which corresponds to Japanese Patent Application No. 2021-021084; with English language translation.

An Office Action; "Reconsideration Report by Examiner before Appeal," mailed by the Japanese Patent Office on Jul. 5, 2022, which corresponds to Japanese Patent Application No. 2021-021084 and is related to U.S. Appl. No. 17/665,167; with English language translation.

An Office Action; "Notification of Reasons for Refusal," issued by the Japanese Patent Office on Nov. 25, 2021, which corresponds to Japanese Patent Application No. 2021-021084; with English language translation.

\* cited by examiner

TEMPERATURE MEASUREMENT METHOD, OPTICAL HEATING METHOD, AND OPTICAL HEATING DEVICE

TECHNICAL FIELD

The present invention relates to a temperature measurement method, an optical heating method, and an optical heating device.

BACKGROUND ART

In a semiconductor manufacturing process, various heat treatments such as a film formation treatment, an oxidation and diffusion treatment, a reforming treatment, and an annealing treatment are performed on a substrate to be treated such as a semiconductor wafer. In these treatments, a heat treatment method using photoirradiation is often employed to enable noncontact treatment. Patent Document 1 described below discloses an optical heating device that includes a semiconductor laser as a light source part for heating, for example.

CITATION LIST

Patent Document

Patent Document 1: JP-A-2003-077857

SUMMARY OF INVENTION

Technical Problem

Heat treatment in semiconductor manufacturing processes, or more specifically, factors such as a temperature and time maintained for heat treatment and a rate at which the temperature goes up or down, influence the quality of manufactured semiconductor devices. Thus, a heat treatment process for the substrate to be treated is required to be measured a temperature of the substrate to be treated with high accuracy during the heat treatment.

Semiconductor manufacturing processes often employ a thermometer that enables contactless temperature measurement using infrared light emitted from the substrate to be treated in order to prevent deposition of dust on the substrate to be treated or generation of scratches in the substrate to be treated.

However, when an optical heating device measures the temperature of the substrate to be treated during the heat treatment by receiving infrared light emitted from the substrate to be treated, the thermometer also receives light transmitted through the substrate to be treated or light emitted from a light source part for heating such as a semiconductor laser and traveling through a chamber while being reflected on the inner wall surface of the chamber. Therefore, a part of the light emitted from the light source part is superimposed on the light observed by the thermometer to measure the temperature of the substrate to be treated, causing an error between the actual temperature of the substrate to be treated and the measurement result.

In view of this, Patent Document 1 discloses an optical heating device that needs no countermeasures for stray light in temperature measurement by setting a predetermined wavelength range used for the temperature measurement by a thermometer to be different from the wavelength range of light emitted from a light source part.

However, even when the optical heating device configured as described above is used for the heat treatment under temperature control, yields may be lower than expected. In addition, the characteristics of fabricated devices often do not reach an expected level.

In view of the above problem, it is an object of the present invention is to provide a temperature measurement method, an optical heating method, and an optical heating device with which it is possible to measure the temperature of a substrate to be treated being heat-treated by light irradiation with higher accuracy.

Solution to Problem

A temperature measurement method according to the present invention includes:
- a step (A) of lighting a light source part to irradiate a substrate to be treated that is an object to be heated with light for heating, the light source part including a plurality of semiconductor light-emitting elements that emits light having a main emission wavelength range of 0.3 μm or more and less than 0.5 μm;
- a step (B) of turning off the light source part after the step (A);
- a step (C) of maintaining an unlit state of the light source part after the step (B); and
- a step (D) of measuring, during the step (C), a temperature of the substrate to be treated through observation of light emitted from the substrate to be treated using a thermometer having a sensitivity wavelength range different from the main emission wavelength range of light emitted from the light source part.

The "main emission wavelength range" in the present specification means a wavelength range where a light intensity is 1% or more with respect to the peak value of light intensity of a spectrum.

Further, the "sensitivity wavelength range" in the present specification means a wavelength range where sensitivity of the thermometer is 20% or more with respect to the peak value of sensitivity for each wavelength. The sensitivity wavelength range of a radiation thermometer is actually measured and confirmed using a spectral sensitivity measuring device or the like. When there are circumstances such as difficulty in measuring the sensitivity wavelength range due to the structure of the thermometer, the sensitivity wavelength range specified by the manufacturer of the thermometer is referred to.

As a result of diligent research on the optical heating device, the present inventors have found that the measurement error mentioned above is caused by the following reasons.

In order to confirm the influence of light emitted from a semiconductor light-emitting element, the present inventors analyzed the spectrum of light emitted from the semiconductor light-emitting element to a level of extremely low intensity of less than 0.5% with respect to the peak intensity. As a result, it is confirmed that the light emitted from the semiconductor light-emitting element includes low-intensity light in a wavelength range on the longer wavelength side with respect to the main emission wavelength range λ1 as shown in FIG. 2B that is referred to in the "DETAILED DESCRIPTION OF THE PREFERRED EMBODIMENTS".

It is recognized that light being emitted from a semiconductor light-emitting element includes, in addition to light in the main emission wavelength range, light that is much lower in intensity itself as compared with the intensity of the light in the main emission wavelength range but has the intensity slightly higher than the intensity at the tail of Gaussian distribution used for approximation in a wavelength range on the longer wavelength side with respect to the main emission wavelength range. Such light having low intensity in the wavelength range on the longer wavelength side with respect to the main emission wavelength range is emitted by a phenomena called deep emission and is estimated to be generated by defects in an active layer or impurity level emission. The deep emission is prominently confirmed mainly in a semiconductor light-emitting element having a main emission wavelength range in the ultraviolet region or in a region on the short wavelength side (purple, blue) in the visible light region.

In the following, light having very low intensity may be referred to as "deep light". The intensity of deep light is extremely lower than the peak intensity, and is less than 0.15% of the peak intensity at the highest, but may be about 0.1% of the peak intensity although there are individual differences among semiconductor light-emitting elements.

That is, it is presumed that, even when the main emission wavelength range of light emitted from the light source part differs from the sensitivity wavelength range of the thermometer, an error is generated between the result of temperature measurement by the thermometer and the actual temperature of the substrate to be treated of interest, because the light emitted from the light source part includes low-intensity light (deep light) in a wavelength range different from the main emission wavelength range.

As a countermeasure against the above problem, the above method includes turning off the semiconductor light-emitting elements of the light source part during the measurement of the temperature of the substrate to be treated by the thermometer through observation of light emitted from the substrate to be treated. Thus, the thermometer does not observe deep light contained in light emitted from the semiconductor light-emitting elements. Accordingly, an error that occurs during measurement of the temperature of the substrate to be treated by the thermometer is reduced.

In the temperature measurement method described above, the sensitivity wavelength range of the thermometer may be set within a range of 0.5 μm or more and less than 5 μm.

In the temperature measurement method described above, the step (D) may be a method for measuring the temperature of the substrate to be treated with a radiation thermometer.

The temperature measurement method according to the present invention preferably employs a radiation thermometer, because the radiation thermometer has a high response speed at which the temperature of the substrate to be treated can be measured immediately after the light source part is an unlit state, and can measure the temperature within a range from several tens of degrees to several thousand degrees.

Here, the case where the substrate to be treated is a silicon wafer will be examined Silicon (Si) which has distinctive emissivity characteristics has a great variation in emissivity with respect to a change in wavelength in a wavelength range of 5 μm or more as seen in the emissivity characteristics from a visible wavelength range to an infrared wavelength range as shown in FIG. 3 that is referred to in "DETAILED DESCRIPTION OF THE PREFERRED EMBODIMENTS". Therefore, the thermometer preferably has a sensitivity wavelength range of 5 μm or less. In the wavelength range of 1 μm or less, there is almost no variation in emissivity depending on temperatures. Therefore, it is preferable to select a thermometer having a sensitivity wavelength range of 5 μm or less and having a wavelength range as short as possible, for example, a thermometer having a sensitivity wavelength range in a wavelength range including a wavelength range of 1 μm or less.

The optical heating method according to the present invention includes:
  a step (A) of lighting a light source part to irradiate a substrate to be treated that is an object to be heated with light for heating, the light source part including a plurality of semiconductor light-emitting elements that emits light having a main emission wavelength range of 0.3 μm or more and less than 0.5 μm;
  a step (B) of turning off the light source part after the step (A);
  a step (C) of maintaining an unlit state of the light source part after the step (B);
  a step (D) of measuring, during the step (C), a temperature of the substrate to be treated through observation of light emitted from the substrate to be treated using a thermometer having a sensitivity wavelength range in a wavelength range different from the main emission wavelength range of light emitted from the light source part; and
  a step (E) of lighting the light source part after the step (D).

The optical heating device according to the present invention is an optical heating device for performing heat treatment of a substrate to be treated, the device including:
  a chamber that accommodates the substrate to be treated;
  a supporter that supports the substrate to be treated in the chamber;
  a light source part that irradiates the substrate to be treated supported by the supporter with light for heating, the light source part including a plurality of semiconductor light-emitting elements that emits light having a main emission wavelength range of 0.3 μm or more and less than 0.5 μm;
  a thermometer that measures a temperature of the substrate to be treated by light emitted from the substrate to be treated, the thermometer having a sensitivity wavelength range in a wavelength range different from the main emission wavelength range of light emitted from the light source part;
  a lighting controller that switches the light source part on and off; and
  a measurement controller that controls the thermometer so as to measure the temperature of the substrate to be treated while the light source part is an unlit state.

In the optical heating device described above, the sensitivity wavelength range of the thermometer may be set within a range of 0.5 μm or more and less than 5 μm.

In the optical heating device described above, the thermometer may be a radiation thermometer.

With the above configuration, the semiconductor light-emitting elements of the light source part are unlit state during the measurement of the temperature of the substrate to be treated by the thermometer through observation of light emitted from the substrate to be treated. Thus, the thermometer has no chance to observe any of deep light and light in the main emission wavelength range emitted from the semiconductor light-emitting elements. Accordingly, errors that may occur during the measurement of the temperature of the substrate to be treated by the thermometer are reduced, and the temperature of the substrate to be treated can be measured with higher accuracy.

The optical heating device may further include a timer that measures a lighting time of the light source part and outputs a notification signal for notifying the lighting controller of a timing of temperature measurement.

With the above configuration, the optical heating device can be configured to automatically repeat the measurement of the temperature of the substrate to be treated at predetermined time intervals. The temperature of the substrate to be treated is automatically confirmed at predetermined time intervals, whereby a variation in temperature of the substrate to be treated can be recognized. Thus, the optical heating device can heat the substrate to be treated while checking whether the temperature is appropriately increased or decreased or whether the temperature is appropriately maintained.

Advantageous Effects of Invention

According to the present invention, there are realized a temperature measurement method and an optical heating device with which it is possible to measure the temperature of a substrate to be treated of interest that is heated by light irradiation with higher accuracy.

DESCRIPTION OF EMBODIMENTS

Figure 1A:
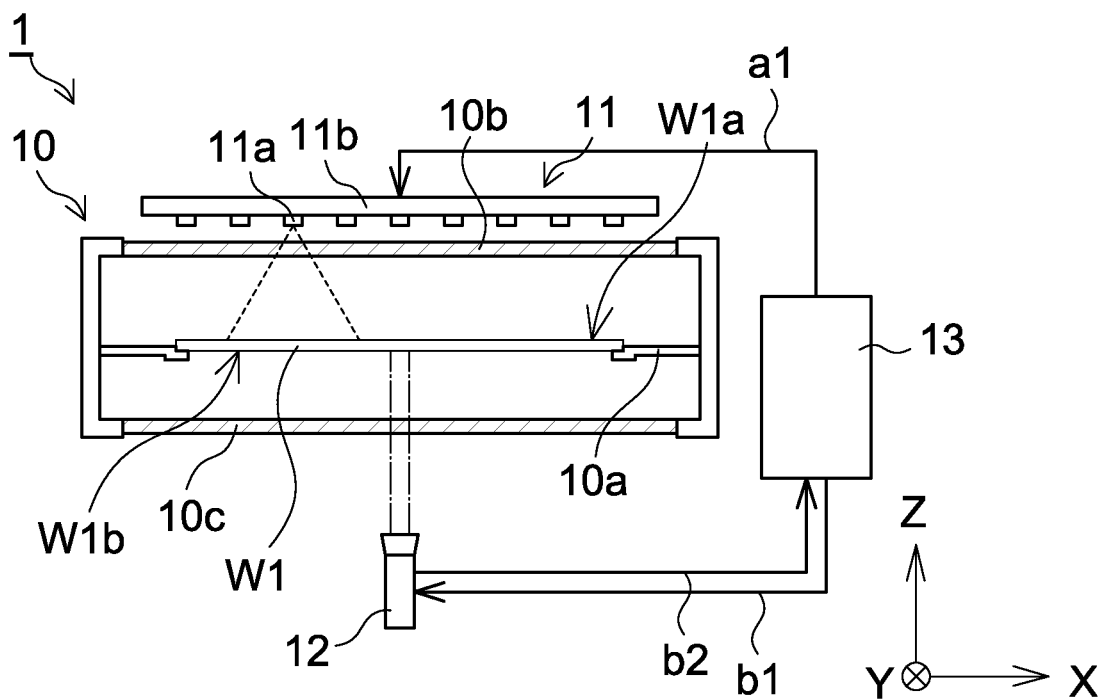
FIG. 1A is a schematic cross-sectional diagram of the configuration of an optical heating device according to an embodiment when viewed in a Y direction.

The temperature measurement method and the optical heating device according to the present invention will be described below with reference to the drawings. The drawings relating to the optical heating device and referred to below are all schematic, and the dimensional ratio or the number in the drawings does not necessarily coincide with the actual dimensional ratio or number.

Figure 1B:
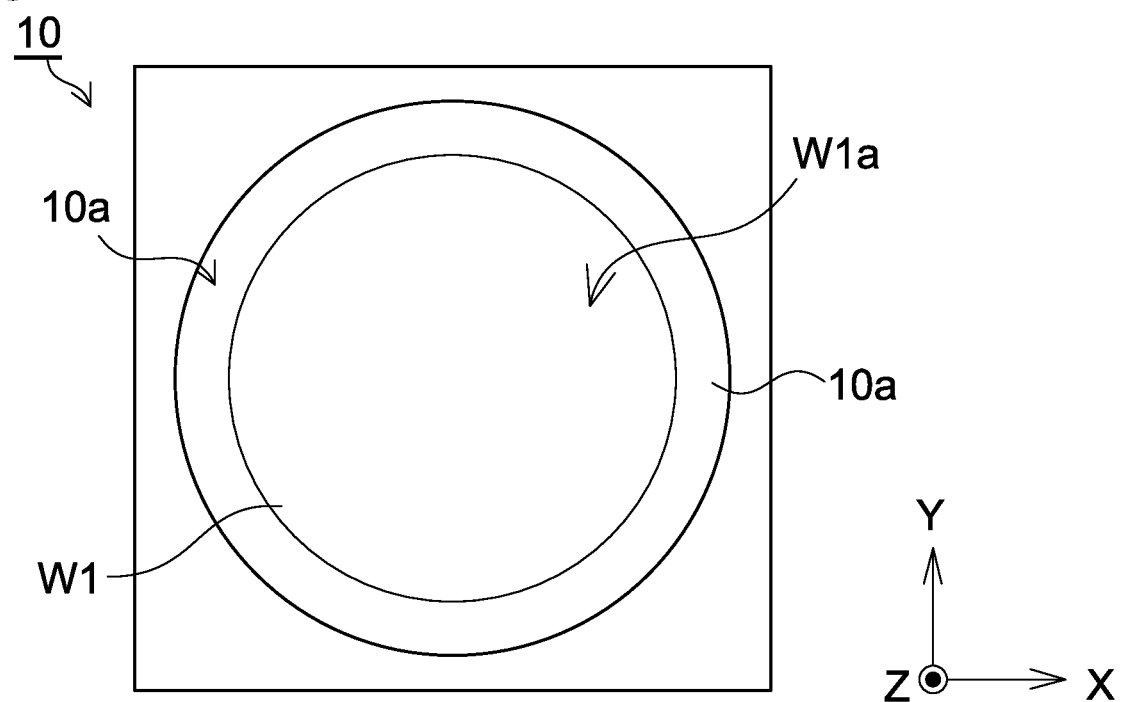
FIG. 1B is a diagram of a chamber in FIG. 1A as viewed from the +Z side.

First, the configuration of an optical heating device 1 will be described. FIG. 1A is a schematic cross-sectional diagram of the configuration of the optical heating device 1 according to one embodiment when viewed in the Y direction, and FIG. 1B is a diagram of a chamber 10 in FIG. 1A as viewed from the +Z side. As shown in FIG. 1A, the optical heating device 1 according to a first embodiment includes the chamber 10 in which a substrate to be treated W1 of interest is accommodated, a light source part 11, a radiation thermometer 12, and a controller 13.

As shown in FIG. 1A, the light source part 11 has multiple LED elements 11a which are semiconductor light-emitting elements and mounted on an LED substrate 11b. The light source part 11 is disposed to emit light for heating to a first main surface W1a of the substrate to be treated W1 supported by a supporter 10a.

In the present embodiment, the substrate to be treated W1 is a silicon wafer. However, the substrate to be treated W1 may be a semiconductor wafer made of a material other than silicon or a glass substrate. The surfaces of the substrate to be treated W1 are respectively defined as a first main surface W1a having a pattern (not shown) formed thereon and a second main surface W1b without having a pattern. The same applies to the case where a semiconductor wafer made of a material other than silicon or a glass substrate is used as the substrate to be treated W1.

In the following description, the direction in which the LED substrate 11b and the substrate to be treated W1 face each other is defined as a Z direction, and the plane orthogonal to the Z direction is defined as an XY plane, as shown in FIGS. 1A and 1B. As shown in FIG. 1B, the directions in which the wall surfaces of the chamber 10 face each other are defined as a X direction and a Y direction, respectively. However, in the present embodiment, there is no particular difference in relation to the X direction and the Y direction, and thus the configuration as viewed in the Y direction as shown in FIG. 1A will be described.

In addition, regarding directions, when positive and negative directions are distinguished from each other, each of the directions is indicated with positive or negative sign. That is, the positive direction is indicated as "+Z direction", and the negative direction is indicated as "−Z direction". On the other hand, when the direction is expressed without distinction between positive and negative directions, the direction is simply referred to as "Z direction".

As shown in FIGS. 1A and 1B, the chamber 10 has the supporter 10a that supports the substrate to be treated W1, a light transmissive window 10b for guiding light emitted from the light source part 11 to the interior of the chamber 10 (more specifically, to the first main surface W1a of the substrate to be treated W1), and an observation window 10c for measuring the temperature of the second main surface W1b of the substrate to be treated W1 by the radiation thermometer 12. In FIG. 1B, a region where the light transmissive window 10b is formed is not hatched so that the configuration inside the chamber 10 can be confirmed.

The light transmissive window 10b transmits at least light emitted from the LED elements 11a, and the observation window 10c transmits infrared light to be observed by the radiation thermometer 12. Note that the light transmissive window 10b and the observation window 10c do not need to transmit all light emitted from the LED elements 11a and light in all sensitivity wavelength ranges from the radiation thermometer 12, respectively, as long as the substrate to be treated W1 can be heated or the measurement by the radiation thermometer 12 can be performed without any troubles.

As shown in FIG. 1A, the radiation thermometer 12 is disposed on the −Z side with respect to the substrate to be treated W1, receives light emitted from the second main surface W1b of the substrate to be treated W1, and measures the temperature of the substrate to be treated W1.

Figure 2A:
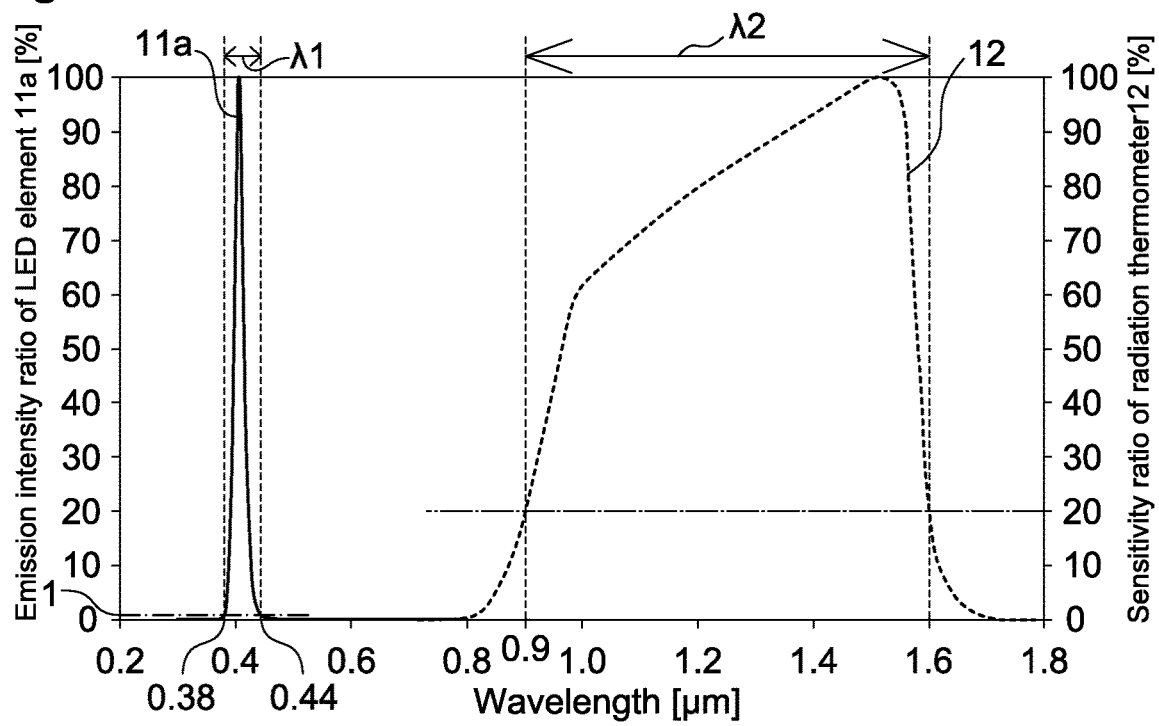
FIG. 2A is a graph showing examples of an emission intensity ratio of light emitted from an LED element and a sensitivity ratio of a radiation thermometer in the embodiment.
Figure 2B:
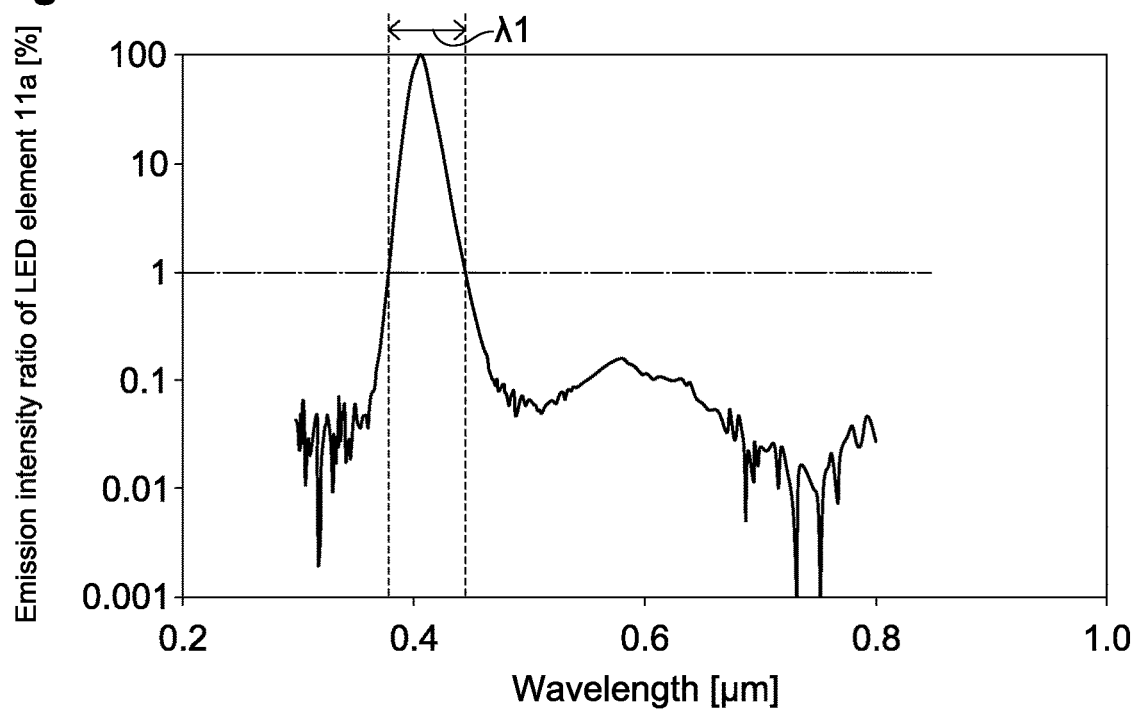
FIG. 2B is a graph showing the emission intensity ratio of the LED element in FIG. 2A on a logarithmic scale.

FIG. 2A is a graph showing an emission intensity ratio of light emitted from the LED element 11a and the sensitivity ratio of the radiation thermometer 12 in the present embodiment, and FIG. 2B is a graph showing the emission intensity ratio of the LED element 11a in FIG. 2A on a logarithmic scale. As shown in FIG. 2A, the light source part 11 is equipped with the LED elements 11a each having a main emission wavelength range λ1 of 0.38 μm to 0.44 μm in the present embodiment. Further, as shown in FIG. 2B, the LED element 11a mounted on the light source part 11 emits light of less than 0.5% of the peak intensity in the wavelength range on the longer wavelength side with respect to the main emission wavelength range λ1.

The radiation thermometer 12 has a sensitivity wavelength range λ2 of 0.9 μm to 1.6 μm. That is, the sensitivity wavelength range λ2 of the radiation thermometer 12 differs from the main emission wavelength range λ1 of the LED element 11a.

The sensitivity wavelength range λ2 of the radiation thermometer 12 may be any wavelength range different from the above-mentioned wavelength range, as long as the wavelength range is set to be different from the main emission wavelength range λ1, is implementable, and can provide expected effects.

In the present embodiment, the radiation thermometer 12 having a sensitivity wavelength range λ2 of 0.9 μm to 1.6 μm is mounted as shown in FIG. 2A. Here, regarding selection of the sensitivity wavelength range λ2 of the radiation thermometer 12, emissivity characteristics of silicon (Si) will be described.

Figure 3:
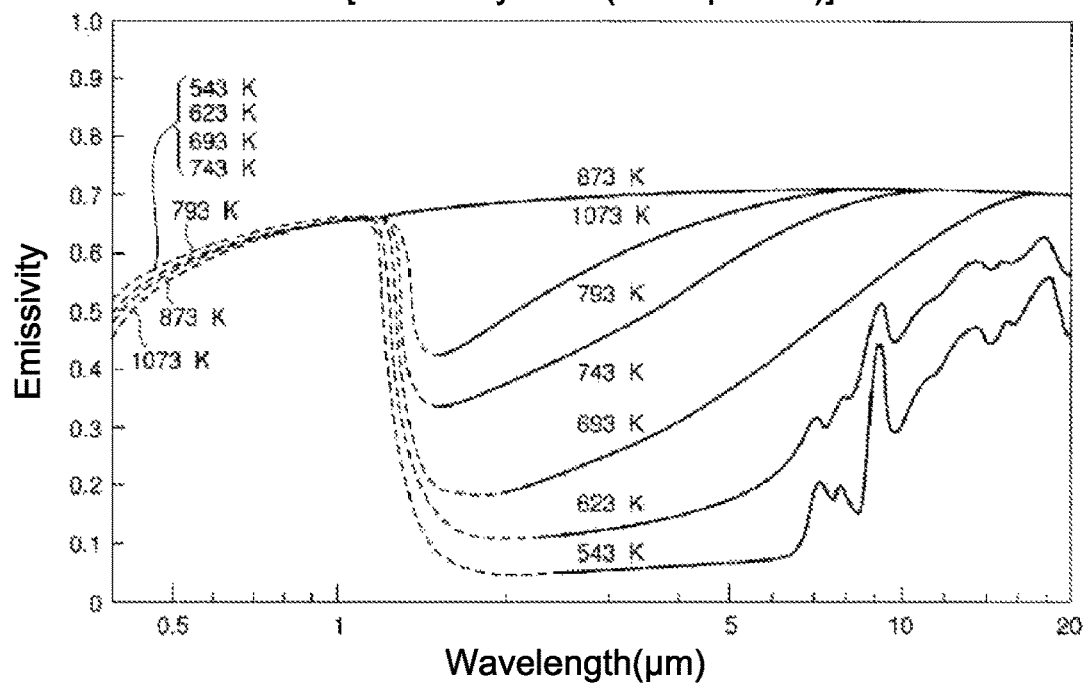
FIG. 3 is a graph showing a relationship between the wavelength of infrared light and emissivity of silicon (Si) at each temperature.

FIG. 3 is a graph showing a relationship between the wavelength of infrared light and the emissivity of silicon (Si) at each temperature. Referring to the emissivity characteristics of silicon from the visible light wavelength range to the infrared wavelength range, the emissivity greatly varies with respect to a change in wavelength range in the wavelength range of 5 μm or more. Thus, the sensitivity wavelength range λ2 of the radiation thermometer 12 is preferably set to a range of less than 5 μm in order to achieve stable temperature measurement with less error.

As shown in FIG. 1A, the controller 13 supplies an electric current a1 to the light source part 11 and outputs a measurement trigger signal b1 for controlling a timing of measuring the temperature to the radiation thermometer 12. The controller 13 also receives an electric signal b2 corresponding to the measured temperature of the substrate to be treated W1 from the radiation thermometer 12.

Figure 4:
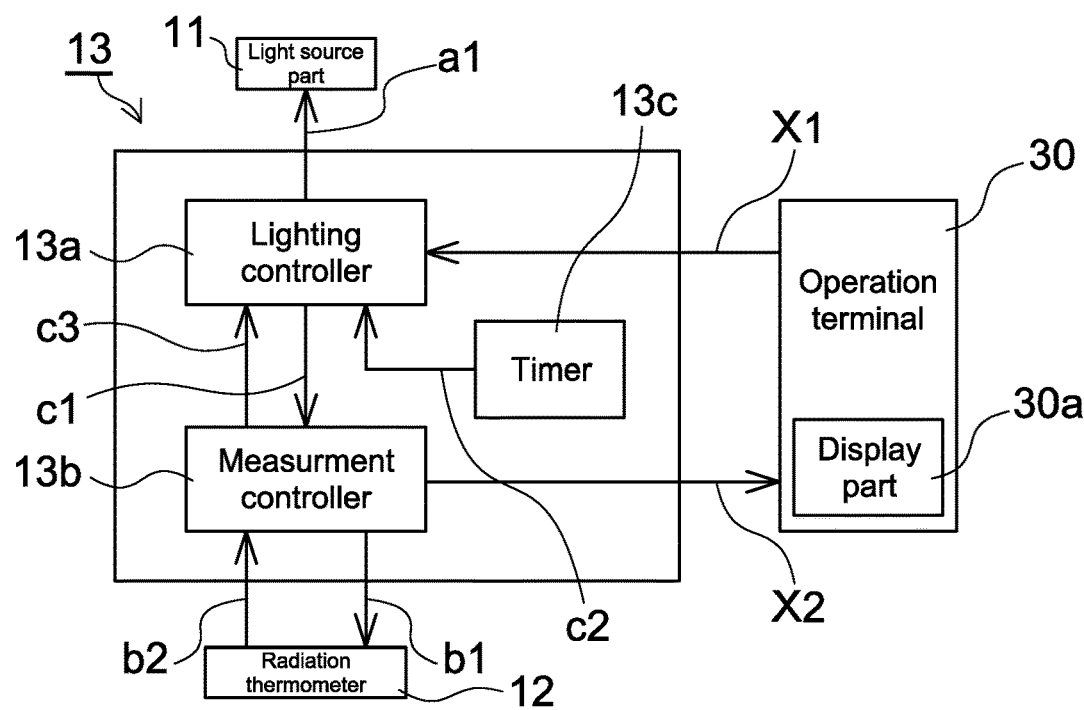
FIG. 4 is a diagram schematically showing the configuration of a controller.

FIG. 4 is a diagram schematically showing the configuration of the controller 13. As shown in FIG. 4, the controller 13 includes a lighting controller 13a, a measurement controller 13b, and a timer 13c. The controller 13 in the present embodiment is configured to control power to be supplied to the light source part 11 by the lighting controller 13a in response to a lighting control signal X1 input from an operation terminal 30 which is an external device.

The lighting controller 13a controls the supply and stop of the electric current a1 to the light source part 11. Further, the lighting controller 13a outputs a measurement start signal c1 for notifying the measurement controller 13b of a timing of starting the measurement. The lighting controller 13a is, for example, an electric circuit that adjusts an amount of electric current supplied to the light source part 11 according to the input lighting control signal X1.

When receiving the measurement start signal c1 from the lighting controller 13a, the measurement controller 13b generates the measurement trigger signal b1 that controls the timing of measuring the temperature of the substrate to be treated W1, and outputs the measurement trigger signal b1 to the radiation thermometer 12.

Further, when receiving the electric signal b2 including information regarding the temperature of the substrate to be treated W1 measured by the radiation thermometer 12 from the radiation thermometer 12, the measurement controller 13b generates and outputs output data X2 including the information regarding the temperature of the substrate to be treated W1 to the operation terminal 30 and outputs a measurement completion signal c3 indicating the completion of the temperature measurement to the lighting controller 13a. The measurement controller 13b is a microcontroller, for example, an MCU or an MPU.

The timer 13c measures the time during which the light source part 11 keeps the lighting state, and outputs a notification signal c2 to the lighting controller 13a when a predetermined time elapses from the start of lighting of the light source part 11.

When receiving the output data X2 output from the measurement controller 13b, the operation terminal 30 displays the temperature of the substrate to be treated W1 on a display part 30a. The operation terminal 30 is an operation panel or the like dedicated to the optical heating device 1, or a general-purpose information processing terminal. Examples of general-purpose information processing terminals include tablets and PCs. The display part 30a is a display of a tablet or a PC.

Figure 5A:
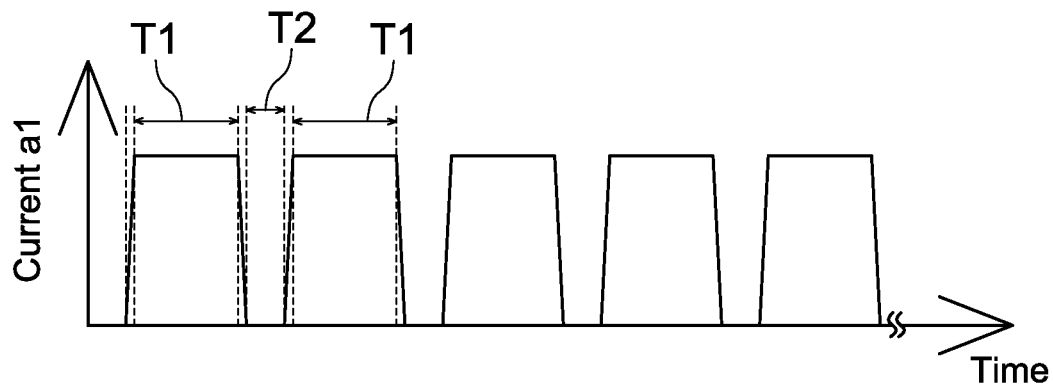
FIG. 5A is a graph showing an example of control of an electric current supplied to a light source part by the controller.
Figure 5B:
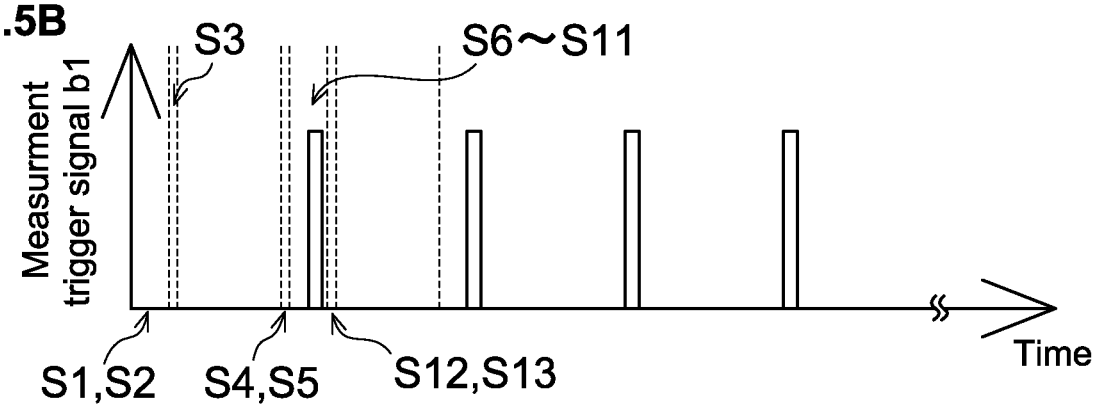
FIG. 5B is a graph showing an example of control of a measurement trigger signal.

FIGS. 5A and 5B is a graph showing an example of control of the electric current a1 supplied by the controller 13 to the light source part 11 and the measurement trigger signal b1. FIG. 5A shows a partially enlarged waveform of the electric current a1 immediately after the start of control, and FIG. 5B shows a partially enlarged waveform of the measurement trigger signal b1 immediately after the start of control.

The temperature measurement method will be described below with reference to FIGS. 5A and 5B based on the configuration of the optical heating device 1.

After the substrate to be treated W1 is placed so as to be supported by the supporter 10a in the chamber 10 as shown in FIGS. 1A and 1B, an operator operates the operation terminal 30 shown in FIG. 4 to give a command to start the heat treatment to the optical heating device 1 (step S1).

When the operator operates the operation terminal 30 to start the heat treatment, the operation terminal 30 supplies the lighting controller 13a with the lighting control signal X1 for starting the supply of the electric current a1 to the light source part 11 (step S2) as shown in FIG. 4.

When receiving the lighting control signal X1, the lighting controller 13a starts supplying the electric current a1 to the light source part 11 and lights the light source part 11 (step S3). This step S3 corresponds to step (A). During this step, the timer 13c starts measuring the lighting time of the light source part 11.

When detecting that a time T1 has elapsed from the start of lighting of the light source part 11, the timer 13c outputs the notification signal c2 indicating the timing of measuring the temperature to the lighting controller 13a (step S4).

When receiving the notification signal c2, the lighting controller 13a stops supplying the electric current a1 to the light source part 11 (step S5). This step S5 corresponds to step (B).

Further, when stopping the supply of the electric current a1 to the light source part 11, the lighting controller 13a outputs the measurement start signal c1 to the measurement controller 13b (step S6).

When receiving the measurement start signal c1, the measurement controller 13b generates the measurement trigger signal b1 for controlling the timing of measuring the temperature of the substrate to be treated W1 from the input measurement start signal c1, and outputs the measurement trigger signal b1 to the radiation thermometer 12 (step S7).

When receiving the measurement trigger signal b1, the radiation thermometer 12 measures the temperature of the second main surface W1b of the substrate to be treated W1 (step S8). As shown in FIG. 5A, the supply of the electric current a1 to the light source part 11 is stopped in step S5, and thus, step S8 is performed in an unlit state. That is, the unlit state of the light source part 11 is maintained so as to correspond to the step (C), and this step S8 performed in a time T2 under the unlit state of the light source part 11 corresponds to step (D).

When the measurement of the temperature of the substrate to be treated W1 is completed, the radiation thermometer 12 outputs the electric signal b2 to the controller 13 (step S9). When the electric signal b2 is input to the controller 13, the electric signal b2 is directly input to the measurement controller 13b.

When receiving the electric signal b2 from the radiation thermometer 12, the measurement controller 13b generates the output data X2 including the temperature information of the substrate to be treated W1 from the electric signal b2 input from the radiation thermometer 12 and outputs the output data X2 to the operation terminal 30 (step S10).

The measurement controller 13b outputs the measurement completion signal c3 indicating the completion of the temperature measurement to the lighting controller 13a in addition to outputting the output data X2 to the operation terminal 30 (step S11).

When receiving the measurement completion signal c3, the lighting controller 13a restarts the supply of the electric current a1 to the light source part 11 (step S12). At this time, the timer 13c starts measuring the lighting time of the light source part 11.

When receiving the output data X2, the operation terminal 30 displays the temperature of the substrate to be treated W1 measured by the radiation thermometer 12 on the display part 30a (step S13).

In the present embodiment, after step S13, the processing returns to step S4, and the temperature of the substrate to be treated W1 is automatically measured at predetermined time intervals as shown in FIG. 5B.

With the above configuration and the above method, the LED elements 11a included in the light source part 11 are unlit state during the measurement of the temperature of the substrate to be treated W1 by the radiation thermometer 12 through observation of light emitted from the substrate to be treated W1. Thus, the radiation thermometer 12 has no chance to observe deep light contained in the light emitted from the LED elements 11a. Accordingly, errors that may occur during the measurement of the temperature of the substrate to be treated W1 by the radiation thermometer 12 are reduced, and the temperature of the substrate to be treated W1 can be measured with high accuracy.

In the present embodiment, a radiation thermometer is used as the thermometer for measuring the temperature of the substrate to be treated W1, but another thermometer which enables contactless temperature measurement through observation of light may be used depending on a temperature range to be measured, a time for maintaining the unlit state, or the like. Examples of thermometers that can be used instead of radiation thermometers include a thermographic camera.

Although the light source part 11 is disposed to emit light toward the first main surface W1a of the substrate to be treated W1 in the present embodiment as shown in FIG. 1A, the light source part 11 may be disposed to emit light toward the second main surface W1b of the substrate to be treated W1.

Although the chamber 10 in the present embodiment is provided with the light transmissive window 10b and the observation window 10c as shown in FIG. 1A, the light transmissive window 10b or the observation window 10c may not be provided to the chamber 10 in a configuration in which the light source part 11 or the radiation thermometer 12 is accommodated in the chamber 10.

Although the present embodiment has described the configuration in which the operator operates the operation terminal 30 different from the optical heating device 1 to perform operations such as starting the heat treatment, the optical heating device 1 may include an operation unit and a display part and may be configured to detect the placement of the carried substrate to be treated W1 at a predetermined position and to automatically start the lighting control. In the case where the heat treatment is performed by automatic control as described above and the operator does not need to check the temperature during the heat treatment, the display part may not be provided.

The present embodiment has described the temperature measurement method in which the temperature measurement is automatically repeated at predetermined time intervals by repeating steps S3 to S14. However, the temperature measurement method may enable the measurement of the temperature of the substrate to be treated W1 only once through, for example, operation of an operation panel by an operator at any timing. Further, in such a case, the optical heating device 1 may not include the timer 13c.

As shown in FIG. 5A, when the lighting controller 13a performs control to light the light source part 11, the electric current a1 having the same electric current value is always supplied to the light source part 11. However, the electric current a1 supplied to the light source part 11 by the lighting controller 13a may vary in electric current value for each time T1 or within the time T1 depending on the elapsed time of the heat treatment or the measurement result of the radiation thermometer 12.

Another Embodiment

Another embodiment will be described below.

Figure 6:
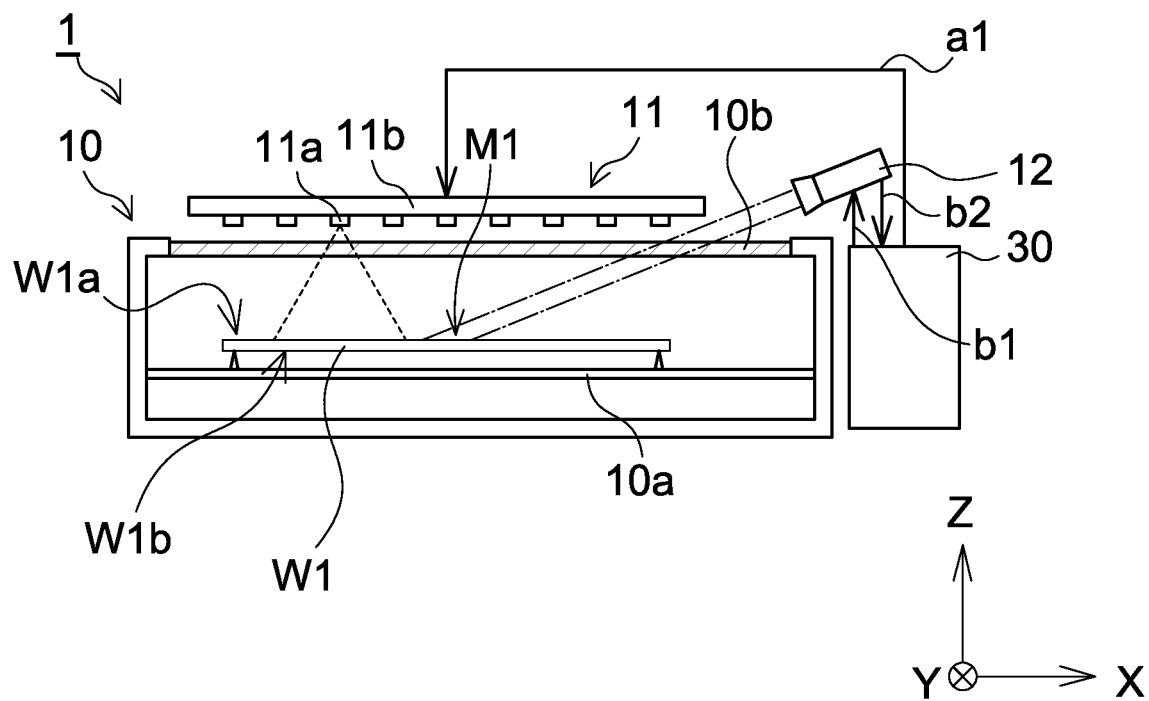
FIG. 6 is a schematic cross-sectional diagram of the configuration of an optical heating device according to another embodiment when viewed in the Y direction.

<1> FIG. 6 is a schematic cross-sectional diagram of the configuration of an optical heating device 1 according to another embodiment when viewed in the Y direction. Although the radiation thermometer 12 in the above embodiment is disposed to measure the temperature of the second main surface W1b of the substrate to be treated W1 as shown in FIG. 1A, the radiation thermometer 12 may be disposed to measure the temperature of the first main surface W1a of the substrate to be treated W1 as shown in FIG. 6.

Further, as shown in FIG. 6, the light source part 11 and the radiation thermometer 12 may be located on the same side with respect to the substrate to be treated W1, and the radiation thermometer 12 may be disposed to measure the temperature of the substrate to be treated W1 in a direction tilted with respect to the Z direction.

Further, any mode is applicable for supporting the substrate to be treated W1 by the supporter 10a as long as the first main surface W1a is located on the XY plane. For example, the supporter 10a may have a plurality of pin-shaped protrusions whereby the substrate to be treated W1 is supported at their tips as shown in FIG. 6.

When the substrate to be treated W1 has a higher reflectance than the transmittance with respect to light in the sensitivity wavelength range of the radiation thermometer 12, the configuration shown in FIG. 1A can further reduce the influence of deep light, because the configuration shown in FIG. 1A suppresses the light emitted from the light source part 11 and reaching the radiation thermometer 12 more effectively than the configuration shown in FIG. 6.

When the substrate to be treated W1 has a lower reflectance than the transmittance with respect to light in the sensitivity wavelength range of the radiation thermometer 12, the configuration shown in FIG. 6 can further reduce the influence of deep light, because the configuration shown in FIG. 6 suppresses the light emitted from the light source part 11 and reaching the radiation thermometer 12 more effectively than the configuration shown in FIG. 1A.

<2> In the above embodiment, the output data X2 may be transmitted to a device other than the operation terminal 30. That is, the terminal (operation terminal 30) for instructing the operation of the optical heating device 1 and the terminal for receiving an input of data (output data X2) including the temperature information which is the measurement result may be the same or different from each other.

<3> The configuration of the optical heating device 1 is merely an example, and the present invention is not limited to each of the illustrated configurations.

What is claimed is:

1. A temperature measurement method comprising:
   a step (A) of lighting a light source part to irradiate a substrate to be treated that is an object to be heated with light for heating, the light source part including a plurality of semiconductor light-emitting elements that emit light having a main emission wavelength range of 0.3 μm or more and less than 0.5 μm
   a step (B) of turning off the light source part after the step (A);
   a step (C) of maintaining an unlit state of the light source part after the step (B); and
   a step (D) of measuring, during the step (C), a temperature of the substrate to be treated through observation of light emitted from the substrate to be treated using a thermometer having a sensitivity wavelength range in a wavelength range different from the main emission wavelength range of light emitted from the light source part,
   wherein the sensitivity wavelength range of the thermometer is within a range of 0.5 μm or more and less than 5 μm.

2. The temperature measurement method according to claim 1, wherein the step (D) involves measuring the temperature of the substrate to be treated with a radiation thermometer.

3. An optical heating method comprising:
   a step (A) of lighting a light source part to irradiate a substrate to be treated that is an object to be heated with light for heating, the light source part including a plurality of semiconductor light-emitting elements that emit light having a main emission wavelength range of 0.3 μm or more and less than 0.5 μm;
   a step (B) of turning off the light source part after the step (A);
   a step (C) of maintaining an unlit state of the light source part after the step (B);
   a step (D) of measuring, during the step (C), a temperature of the substrate to be treated through observation of light emitted from the substrate to be treated using a thermometer having a sensitivity wavelength range in a wavelength range different from the main emission wavelength range of light emitted from the light source part; and
   a step (E) of lighting the light source part after the step (D),
   wherein the sensitivity wavelength range of the thermometer is within a range of 0.5 μm or more and less than 5 μm.

4. An optical heating device for performing heat treatment of a substrate to be treated, the device comprising:
   a chamber that accommodates the substrate to be treated;
   a supporter that supports the substrate to be treated in the chamber;
   a light source part that irradiates the substrate to be treated supported by the supporter with light for heating, the light source part including a plurality of semiconductor light-emitting elements that emit light having a main emission wavelength range of 0.3 μm or more and less than 0.5 μm;
   a thermometer that measures a temperature of the substrate to be treated by light emitted from the substrate to be treated, the thermometer having a sensitivity wavelength range in a wavelength range different from the main emission wavelength range of light emitted from the light source part;
   a lighting controller that switches the light source part on and off; and
   a measurement controller that controls the thermometer so as to measure the temperature of the substrate to be treated while the light source part is an unlit state,
   wherein the sensitivity wavelength range of the thermometer is within a range of 0.5 μm or more and less than 5 μm.

5. The optical heating device according to claim 4, wherein the thermometer is a radiation thermometer.

6. The optical heating device according to claim 4, further comprising a timer that measures a lighting time of the light source part and outputs a notification signal for notifying the lighting controller of a timing of temperature measurement.

* * * * *